United States Patent
Chen et al.

(10) Patent No.: US 7,993,962 B2
(45) Date of Patent: Aug. 9, 2011

(54) I-SHAPED PHASE CHANGE MEMORY CELL

(75) Inventors: Shih-Hung Chen, Hsinchu (TW); Hsiang-Lan Lung, Dobbs Ferry, NY (US)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 12/614,902

(22) Filed: Nov. 9, 2009

(65) Prior Publication Data

US 2010/0055830 A1    Mar. 4, 2010

Related U.S. Application Data

(62) Division of application No. 11/348,848, filed on Feb. 7, 2006, now Pat. No. 7,635,855.

(60) Provisional application No. 60/736,720, filed on Nov. 15, 2005.

(51) Int. Cl.
*H01L 21/06* (2006.01)

(52) U.S. Cl. .......... 438/102; 438/95; 438/238; 438/244; 257/E21.068

(58) Field of Classification Search .................. 438/102, 438/238, 244; 257/E21.068
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 3,846,767 A | 11/1974 | Cohen | |
| 4,452,592 A | 6/1984 | Tsai | |
| 4,599,705 A | 7/1986 | Holmberg et al. | |
| 4,719,594 A | 1/1988 | Young et al. | |
| 4,769,339 A | 9/1988 | Ishii et al. | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |
| 5,177,567 A | 1/1993 | Klersy et al. | |

(Continued)

FOREIGN PATENT DOCUMENTS

WO    WO-2004025659 A1    3/2004

OTHER PUBLICATIONS

"Magnetic Bit Boost," www.sciencenews.org, Dec. 18 & 25, 2004, p. 389, vol. 166.

(Continued)

*Primary Examiner* — Angel Roman
(74) *Attorney, Agent, or Firm* — Haynes Beffel & Wolfeld LLP

(57) ABSTRACT

A memory device includes two electrodes, vertically separated and having mutually opposed contact surfaces, between which lies a phase change cell. The phase change cell includes an upper phase change member, having a contact surface in electrical contact with the first electrode; a lower phase change member, having a contact surface in electrical contact with the second electrode; and a kernel member disposed between and in electrical contact with the upper and lower phase change members. The phase change cell is formed of material having at least two solid phases, and the lateral extent of the upper and lower phase change members is substantially greater than that of the kernel member. An intermediate insulating layer is disposed between the upper and lower phase change members adjacent to the kernel member.

36 Claims, 8 Drawing Sheets

U.S. PATENT DOCUMENTS

| | | | |
|---|---|---|---|
| 5,332,923 A | 7/1994 | Takeuchi et al. |
| 5,391,901 A | 2/1995 | Tanabe et al. |
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,688,713 A | 11/1997 | Linliu et al. |
| 5,716,883 A | 2/1998 | Tseng et al. |
| 5,754,472 A | 5/1998 | Sim et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji et al. |
| 6,066,870 A | 5/2000 | Siek |
| 6,075,719 A | 6/2000 | Lowrey et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,507,061 B1 | 1/2003 | Hudgens et al. |
| 6,511,867 B2 | 1/2003 | Lowrey et al. |
| 6,512,241 B1 | 1/2003 | Lai |
| 6,512,263 B1 | 1/2003 | Yuan et al. |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,744,088 B1 | 6/2004 | Dennison |
| 6,750,079 B2 | 6/2004 | Lowrey et al. |
| 6,750,101 B2 | 6/2004 | Lung et al. |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,838,692 B1 | 1/2005 | Lung et al. |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen |
| 6,998,289 B2 | 2/2006 | Hudgens et al. |
| 7,023,008 B1 | 4/2006 | Happ |
| 7,023,009 B2 | 4/2006 | Kostylev et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung et al. |
| 7,078,273 B2 | 7/2006 | Matsuoka et al. |
| 7,099,180 B1 | 8/2006 | Dodge et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,126,847 B2 | 10/2006 | Ha et al. |
| 7,132,675 B2 | 11/2006 | Gilton |
| 7,151,273 B2 | 12/2006 | Campbell et al. |

| | | | | | | |
|---|---|---|---|---|---|---|
| 7,154,774 | B2 | 12/2006 | Bedeschi et al. | 2005/0191804 A1 | 9/2005 | Lai et al. |
| 7,158,411 | B2 | 1/2007 | Yeh et al. | 2005/0195633 A1 | 9/2005 | Choi et al. |
| 7,164,147 | B2 | 1/2007 | Lee et al. | 2005/0201182 A1 | 9/2005 | Osada et al. |
| 7,166,533 | B2 | 1/2007 | Happ | 2005/0212024 A1 | 9/2005 | Happ |
| 7,169,635 | B2 | 1/2007 | Kozicki | 2005/0212026 A1 | 9/2005 | Chung et al. |
| 7,202,493 | B2 | 4/2007 | Lung et al. | 2005/0215009 A1 | 9/2005 | Cho |
| 7,208,751 | B2 | 4/2007 | Ooishi et al. | 2005/0263829 A1 | 12/2005 | Song et al. |
| 7,214,958 | B2 | 5/2007 | Happ | 2006/0006472 A1 | 1/2006 | Jiang |
| 7,220,983 | B2 | 5/2007 | Lung | 2006/0018156 A1 | 1/2006 | Happ |
| 7,229,883 | B2 | 6/2007 | Wang et al. | 2006/0038221 A1 | 2/2006 | Lee et al. |
| 7,238,959 | B2 | 7/2007 | Chen | 2006/0066156 A1 | 3/2006 | Dong et al. |
| 7,238,994 | B2 | 7/2007 | Chen et al. | 2006/0073642 A1 | 4/2006 | Yeh et al. |
| 7,248,494 | B2 | 7/2007 | Oh et al. | 2006/0091476 A1 | 5/2006 | Pinnow et al. |
| 7,251,157 | B2 | 7/2007 | Osada et al. | 2006/0094154 A1 | 5/2006 | Lung |
| 7,253,429 | B2 | 8/2007 | Klersy et al. | 2006/0108667 A1 | 5/2006 | Lung |
| 7,254,059 | B2 | 8/2007 | Li et al. | 2006/0110878 A1 | 5/2006 | Lung et al. |
| 7,262,502 | B2 | 8/2007 | Chang | 2006/0110888 A1 | 5/2006 | Cho et al. |
| 7,269,052 | B2 | 9/2007 | Segal et al. | 2006/0113520 A1 | 6/2006 | Yamamoto et al. |
| 7,277,317 | B2 | 10/2007 | Le Phan et al. | 2006/0113521 A1 | 6/2006 | Lung |
| 7,291,556 | B2 | 11/2007 | Choi et al. | 2006/0118913 A1 | 6/2006 | Yi et al. |
| 7,309,630 | B2 | 12/2007 | Fan et al. | 2006/0124916 A1 | 6/2006 | Lung |
| 7,314,776 | B2 | 1/2008 | Johnson et al. | 2006/0126395 A1 | 6/2006 | Chen et al. |
| 7,317,201 | B2 | 1/2008 | Gutsche et al. | 2006/0131555 A1 | 6/2006 | Liu et al. |
| 7,321,130 | B2 | 1/2008 | Lung et al. | 2006/0138467 A1 | 6/2006 | Lung |
| 7,323,708 | B2 | 1/2008 | Lee et al. | 2006/0154185 A1 | 7/2006 | Ho et al. |
| 7,323,734 | B2 | 1/2008 | Ha et al. | 2006/0157680 A1 | 7/2006 | Takaura et al. |
| 7,332,370 | B2 | 2/2008 | Chang et al. | 2006/0157681 A1 | 7/2006 | Chen et al. |
| 7,336,526 | B2 | 2/2008 | Osada et al. | 2006/0163554 A1 | 7/2006 | Lankhorst et al. |
| 7,351,648 | B2 | 4/2008 | Furukawa et al. | 2006/0169968 A1 | 8/2006 | Happ |
| 7,359,231 | B2 | 4/2008 | Venkataraman et al. | 2006/0172067 A1 | 8/2006 | Ovshinsky et al. |
| 7,364,935 | B2 | 4/2008 | Lung et al. | 2006/0175599 A1 | 8/2006 | Happ |
| 7,365,385 | B2 | 4/2008 | Abbott | 2006/0192193 A1 | 8/2006 | Lee et al. |
| 7,379,328 | B2 | 5/2008 | Osada et al. | 2006/0198183 A1 | 9/2006 | Kawahara et al. |
| 7,385,235 | B2 | 6/2008 | Lung et al. | 2006/0202245 A1 | 9/2006 | Zuliani et al. |
| 7,388,273 | B2 | 6/2008 | Burr et al. | 2006/0205108 A1 | 9/2006 | Maimon et al. |
| 7,394,088 | B2 | 7/2008 | Lung | 2006/0211165 A1 | 9/2006 | Hwang et al. |
| 7,397,060 | B2 | 7/2008 | Lung | 2006/0226409 A1* | 10/2006 | Burr et al. ......... 257/2 |
| 7,400,522 | B2 | 7/2008 | Toda et al. | 2006/0234138 A1 | 10/2006 | Fehlhaber et al. |
| 7,423,300 | B2 | 9/2008 | Lung et al. | 2006/0237756 A1 | 10/2006 | Park et al. |
| 7,426,134 | B2 | 9/2008 | Happ et al. | 2006/0245236 A1 | 11/2006 | Zaidi |
| 7,440,308 | B2 | 10/2008 | Jeong et al. | 2006/0250885 A1 | 11/2006 | Cho et al. |
| 7,449,710 | B2 | 11/2008 | Lung | 2006/0261321 A1 | 11/2006 | Happ et al. |
| 7,473,576 | B2 | 1/2009 | Lung | 2006/0261392 A1 | 11/2006 | Lee et al. |
| 7,479,649 | B2 | 1/2009 | Lung | 2006/0266993 A1 | 11/2006 | Suh et al. |
| 7,485,891 | B2 | 2/2009 | Hamann et al. | 2006/0284157 A1 | 12/2006 | Chen et al. |
| 7,502,252 | B2 | 3/2009 | Fuji et al. | 2006/0284158 A1 | 12/2006 | Lung et al. |
| 7,507,986 | B2 | 3/2009 | Lung | 2006/0284214 A1 | 12/2006 | Chen |
| 7,514,334 | B2 | 4/2009 | Chen et al. | 2006/0284279 A1 | 12/2006 | Lung et al. |
| 7,514,705 | B2 | 4/2009 | Breitwisch et al. | 2006/0286709 A1 | 12/2006 | Lung et al. |
| 7,515,461 | B2 | 4/2009 | Happ et al. | 2006/0286743 A1 | 12/2006 | Lung et al. |
| 7,569,844 | B2 | 8/2009 | Lung | 2006/0289847 A1 | 12/2006 | Dodge |
| 7,683,360 | B2 | 3/2010 | Chen et al. | 2006/0289848 A1 | 12/2006 | Dennison |
| 2002/0017701 | A1 | 2/2002 | Klersy et al. | 2007/0007613 A1 | 1/2007 | Wang et al. |
| 2002/0070457 | A1 | 6/2002 | Sun et al. | 2007/0008786 A1 | 1/2007 | Scheuerlein |
| 2002/0113273 | A1 | 8/2002 | Hwang et al. | 2007/0030721 A1 | 2/2007 | Segal et al. |
| 2002/0168852 | A1 | 11/2002 | Harshfield et al. | 2007/0037101 A1 | 2/2007 | Morioka |
| 2003/0072195 | A1 | 4/2003 | Mikolajick | 2007/0040159 A1 | 2/2007 | Wang |
| 2003/0095426 | A1 | 5/2003 | Hush et al. | 2007/0051936 A1 | 3/2007 | Pellizzer et al. |
| 2003/0116794 | A1 | 6/2003 | Lowrey | 2007/0072125 A1 | 3/2007 | Sousa et al. |
| 2003/0186481 | A1 | 10/2003 | Lung | 2007/0096162 A1 | 5/2007 | Happ et al. |
| 2003/0209746 | A1 | 11/2003 | Horii | 2007/0096248 A1 | 5/2007 | Philipp et al. |
| 2004/0026686 | A1 | 2/2004 | Lung | 2007/0108077 A1 | 5/2007 | Lung et al. |
| 2004/0051094 | A1 | 3/2004 | Ooishi | 2007/0108429 A1 | 5/2007 | Lung |
| 2004/0099930 | A1* | 5/2004 | Konishi ......... 257/660 | 2007/0108430 A1 | 5/2007 | Lung |
| 2004/0113137 | A1 | 6/2004 | Lowrey | 2007/0108431 A1 | 5/2007 | Chen et al. |
| 2004/0165422 | A1 | 8/2004 | Hideki et al. | 2007/0109836 A1 | 5/2007 | Lung |
| 2004/0245554 | A1 | 12/2004 | Oh et al. | 2007/0109843 A1 | 5/2007 | Lung et al. |
| 2004/0248339 | A1 | 12/2004 | Lung | 2007/0111429 A1 | 5/2007 | Lung |
| 2004/0256610 | A1 | 12/2004 | Lung | 2007/0115794 A1 | 5/2007 | Lung |
| 2005/0018526 | A1 | 1/2005 | Lee | 2007/0117315 A1 | 5/2007 | Lai et al. |
| 2005/0029502 | A1 | 2/2005 | Hudgens | 2007/0120104 A1 | 5/2007 | Ahn et al. |
| 2005/0052904 | A1 | 3/2005 | Cho et al. | 2007/0121363 A1 | 5/2007 | Lung |
| 2005/0062087 | A1 | 3/2005 | Chen et al. | 2007/0121374 A1 | 5/2007 | Lung et al. |
| 2005/0093022 | A1 | 5/2005 | Lung | 2007/0126040 A1 | 6/2007 | Lung |
| 2005/0112903 | A1* | 5/2005 | Yang et al. ......... 438/745 | 2007/0131922 A1 | 6/2007 | Lung |
| 2005/0127349 | A1 | 6/2005 | Horak et al. | 2007/0138458 A1 | 6/2007 | Lung |
| 2005/0141261 | A1 | 6/2005 | Ahn | 2007/0147105 A1 | 6/2007 | Lung et al. |
| 2005/0145984 | A1 | 7/2005 | Chen et al. | 2007/0153563 A1 | 7/2007 | Nirschl |
| 2005/0167656 | A1 | 8/2005 | Sun et al. | 2007/0154847 A1 | 7/2007 | Chen et al. |

| | | | |
|---|---|---|---|
| 2007/0155172 A1 | 7/2007 | Lai et al. |
| 2007/0156949 A1 | 7/2007 | Rudelic et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0170881 A1 | 7/2007 | Noh et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0252127 A1 | 11/2007 | Arnold et al. |
| 2007/0257300 A1 | 11/2007 | Ho et al. |
| 2007/0262388 A1 | 11/2007 | Ho et al. |
| 2007/0267618 A1 | 11/2007 | Zaidi et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0106923 A1 | 5/2008 | Lung |
| 2008/0137400 A1 | 6/2008 | Chen et al. |
| 2008/0138929 A1 | 6/2008 | Lung |
| 2008/0138930 A1 | 6/2008 | Lung |
| 2008/0138931 A1 | 6/2008 | Lung |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2008/0265234 A1 | 10/2008 | Breitwisch et al. |
| 2008/0303014 A1 | 12/2008 | Goux et al. |
| 2008/0310208 A1 | 12/2008 | Daley |
| 2009/0001341 A1 | 1/2009 | Breitwisch et al. |
| 2009/0014704 A1 | 1/2009 | Chen et al. |
| 2009/0023242 A1 | 1/2009 | Lung |
| 2009/0027950 A1 | 1/2009 | Lam et al. |
| 2009/0042335 A1 | 2/2009 | Lung |
| 2009/0057641 A1 | 3/2009 | Lung |
| 2009/0072215 A1 | 3/2009 | Lung et al. |
| 2009/0098678 A1 | 4/2009 | Lung |
| 2009/0166603 A1 | 7/2009 | Lung |
| 2009/0268507 A1 | 10/2009 | Breitwisch et al. |
| 2009/0289242 A1 | 11/2009 | Breitwisch et al. |
| 2009/0294748 A1 | 12/2009 | Breitwisch et al. |
| 2010/0055830 A1 | 3/2010 | Chen et al. |

OTHER PUBLICATIONS

"New Memories Tap Spin, Gird for Battle," Science News, Apr. 3, 1999, p. 223, vol. 155.
"Remembering on the Cheap," www.sciencenews.org, Mar. 19, 2005, p. 189, vol. 167.
Adler, D. et al., "Threshold Switching in Chalcogenide-Glass Thin Films," J. Appl/Phys 51(6), Jun. 1980, pp. 3289-3309.
Adler, David, "Amorphous-Semiconductor Devices," Sci. Amer., vol. 236, pp. 36-48, May 1977.
Ahn, S. J. et al., "A Highly Manufacturable High Density Phase Change Memory of 64 Mb and Beyond," IEEE IEDM Dec. 13-15, 2004, pp. 907-910.
Axon Technologies Corporation paper: Technology Description, published in 1997, pp. 1-6.
Bedeschi, F. et al., "4-MB MOSFET-Selected Phase-Change Memory Experimental Chip," IEEE, Sep. 21 to 23, 2004, 4 PP.
Blake thesis, "Investigation of GeTeSb5 Chalcogenide Films for Use as an Analog Memory," AFIT/GE/ENG/00M-04, Mar. 2000, 121 pages.
Chen, An et al., "Non-Volatile Resistive Switching for Advanced Memory Applications," IEEE IEDM, Dec. 5-7, 2005, 4 pp.
Cho, S. L. et al., "Highly Scalable On-axis Confined Cell Structure for High Density PRAM beyond 256Mb," Jun. 14-16, 2005 Symposium on VLSI Technology Digest of Technical Papers, pp. 96-97.
Gibson, G. A. et al., "Phase-change Recording Medium that Enables Ultrahigh-density Electron-beam Data Storage," Applied Physics Letter, 2005, 3 pp., vol. 86.
Gill, Manzur et al., "A High-Performance Nonvolatile Memory Technology for Stand-Alone Memory and Embedded Applications," 2002 IEEE-ISSCC Technical Digest (TD 12.4), 7 pp.
Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.
Happ, T. D. et al., "Novel None-Mask Self-Heating Pillar Phase Change Memory," 2006 Symposium on VLSI Technology, 2 pp.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.
Horii, H. et al., "A Novel Cell Technology Using N-doped GeSbTe Films for Phase Change RAM," Jun. 10-12, 2003 Symposium on VLSI Technology Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.
Iwasaki, Hiroko et al., "Completely Erasable Phase Change Optical Disk," Jpn. J. Appl. Phys., Feb. 1992, pp. 461-465, vol. 31.
Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.
Kim, Kinam et al., "Reliability Investigations for Manufacturable High Density PRAM," IEEE 43rd Annual International Reliability Physics Symposium, San Jose, Apr. 17-21, 2005, pp. 157-162.
Kojima, Rie et al., "Ge-Sn-Sb-Te Phase-change Recording Material Having High Crystallization Speed," Proceedings of PCOS 2000, pp. 36-41.
Lacita, A. L., "Electrothermal and Phase-change Dynamics in Chalcogenide-based Memories," IEEE IEDM Dec. 13-15, 2004, 4 pp.
Lai, Stefan, "Current Status of the Phase Change Memory and Its Future," IEEE IEDM Dec. 10, 2003, pp. 255-258.
Lai, Stephan et al., "OUM-A 180 nm Nonvolatile Memory Cell Element Technology for Stand Alone and Embedded Applications," IEEE IEDM Dec. 2-5, 2001, pp. 803-806.
Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.
Mott, Nevill, "Electrons in Glass," Nobel Lecture, Dec. 8, 1977, Physics, 1977, pp. 403-413.
Ovonyx Non-Confidential paper entitled "Ovonic Unified Memory," Dec. 1999, pp. 1-80.
Ovshinsky, Sandford R., "Reversible Electrical Switching Phenomena in Disordered Structures," Physical Review Letters, vol. 21, No. 20, Nov. 11, 1968, pp. 1450-1453.
Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel u Trench Phase-Change Memory Cell for Embedded and Stand-Alone Non-Volatile Memory Applications," Jun. 15-17, 2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE Jun. 4-7, 2002, pp. 237-240.

Strauss, Karl F. et al., "Overview of Radiation Tolerant Unlimited Write Cycle Non-Volatile Memory," IEEE Mar. 18-25, 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era—vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM Dec. 10, 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Non-Final Office Action mailed Apr. 2, 2008 for U.S. Appl. No. 11/348,846, filed Feb. 7, 2006.

Amendment After Non-Final filed on Aug. 4, 2008 in response to Apr. 2, 2008 Non-Final Office Action for U.S. Appl. No. 11/348,846, filed Feb. 7, 2006.

Office Action (Restriction) mailed Apr. 8, 2008, U.S. Appl. No. 11/348,848.

Office Action mailed Jul. 10, 2008, U.S. Appl. No. 11/348,848.

Office Action mailed Feb. 17, 2009, U.S. Appl. No. 11/348,848.

Notice of Allowance, mailed Aug. 7, 2009, U.S. Appl. No. 11/348,848.

"Optimized Thermal Capacitance in a Phase Change Memory Cell Design," IPCOM000141986D, IP.com Prior Art Database, Oct. 18, 2006, 4pp.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, published at least as early as Dec. 1997, pp. 1-6.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Gill, Manzur et al., "A High-Performance Nonvolatile Memory Technology for Stand-Alone Memory and Embedded Applications," Feb. 3-7, 2002 IEEE-ISSCC Technical Digest (TD 12.4), 7 pp.

Gleixner, "Phase Change Memory Reliability", 22nd NVSMW, Aug. 26, 2007, 46 pages.

Hanzawa, Satoru, et al., "A 512kB Embedded Phase Change Memory with 416kB/s Write Throughput at 100µA Cell Write Current," ISSCC 2007, Session 26, Non-Volatile Memories/26.2, 3 pages.

Li, Yiming, "Temperature dependence on the contact size of GeSbTe films for phase change memories," J. Comput Electron (2008) 7:138-141.

Oh, Hyung-Rok, et al., "Enhanced Write Performance of a 64Mb Phase-Change Random Access Memory," ISSCC 2005, Session 2, Non-Volatile Memory, 2.3, 3 pages.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Yamada, Noboru, "Potential of Ge-Sb-Te phase-change optical disks for high-data-rate recording in the near future," (Conference Proceedings Paper), Jul. 30, 1997, vol. 3109, 10 pages.

* cited by examiner

I-SHAPED PHASE CHANGE MEMORY CELL

REFERENCE TO RELATED APPLICATION

This application is a Divisional of copending U.S. application Ser. No. 11/348,848, by Shih Hung Chen and Hsiang-Lan Lung, titled "I-shaped phase change memory cell", filed Feb. 7, 2006, which claims the benefit of U.S. Provisional Application No. 60/736,720, by Shih Hung Chen and Hsiang-Lan Lung, titled "I-shaped phase change memory cell", which was filed on Nov. 15, 2005. The foregoing applications are incorporated by reference herein for all purposes.

PARTIES TO A JOINT RESEARCH AGREEMENT

International Business Machines Corporation, a New York corporation; Macronix International Corporation, Ltd., a Taiwan corporation; and Infineon Technologies AG, a German corporation, are parties to a Joint Research Agreement.

BACKGROUND OF THE INVENTION

1. Field of the Invention

The present invention relates to high density memory devices based on phase change based memory materials, including chalcogenide based materials and other materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000, and Reinberg, "Chalcogenide Memory Cell with a Plurality of Chalcogenide Electrodes," U.S. Pat. No. 5,920,788, issued Jul. 6, 1999.

A specific issue arising from conventional phase change memory and structures is the heat sink effect of conventional designs. Generally, the prior art teaches the use of metallic electrodes on both sides of the phase change memory element, with electrodes of approximately the same size as the phase change member. Such electrodes act as heat sinks, the high heat conductivity of the metal rapidly drawing heat away from the phase change material. Because the phase change occurs as a result of heating, the heat sink effect results in a requirement for higher current, in order to effect the desired phase change.

Moreover, problems have arisen in manufacturing such devices with very small dimensions, and with variations in process that meets tight specifications needed for large-scale memory devices. It is desirable therefore to provide a memory cell structure having small dimensions and low reset currents, as well as a structure that addresses the heat conductivity problem, and a method for manufacturing such structure that meets tight process variation specifications needed for large-scale memory devices. It is further desirable to provide a manufacturing process and a structure, which are compatible with manufacturing of peripheral circuits on the same integrated circuit.

SUMMARY OF THE INVENTION

An embodiment of the present invention features a memory device including two electrodes, vertically separated and having mutually opposed contact surfaces, between which lies a phase change cell. The phase change cell includes an upper phase change member, having a contact surface in electrical contact with the first electrode; a lower phase change member, having a contact surface in electrical contact with the second electrode; and a kernel member disposed between and in electrical contact with the upper and lower phase change members. The phase change cell is formed of material having at least two solid phases, and the lateral extent of the upper and lower phase change members is substantially greater than that of the kernel member. An intermediate insulating layer is disposed between the upper and lower phase change members adjacent to the kernel member.

In another aspect of the invention, a method for constructing a phase change memory element comprises the steps of providing a substrate having an electrode element extending therethrough; depositing a first layer of phase change material having a desired thickness onto the substrate; depositing a kernel layer of phase change material, having a desired thickness and a width substantially less than the width of the first layer, onto the first phase change layer; and depositing a second phase change layer, having a desired thickness and a width substantially the same as the first layer, onto the kernel layer.

Another aspect of the invention is a computer memory array, including data communication lines for communicating word and bit enabling signals to the array and a plurality of memory cells. Each memory cell includes at least one access transistor and a phase change element, and each phase change element includes an upper phase change member; a lower phase change member; and a kernel member disposed between and in electrical contact with the upper and lower phase change members. Within the phase change member, the phase change cell is formed of material having at least two solid phases; and the lateral extent of the upper and lower phase change members is substantially greater than that of the kernel member.

Particular aspects of the present invention are described in the claims, specification and drawings, which illustrate the present invention but do not limit it. The invention is defined solely by the claims appended hereto.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Figure 1:
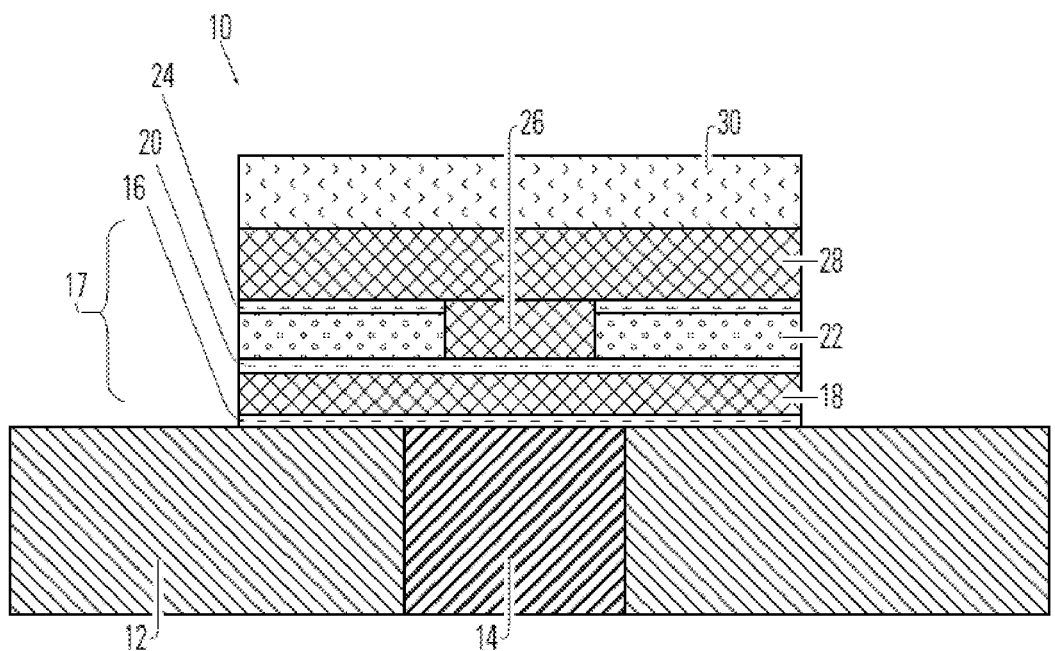
FIG. 1 illustrates an embodiment of the phase change memory cell of the present invention.

FIG. 1 illustrates the basic layout of a phase change memory element according to the present invention. As is known in the art, phase change random access memory (PCRAM) cells 10 include a phase change element 17, formed from a material having two solid phases. Preferably, such material changes phase from amorphous to crystalline and back again, upon application of suitable current pulses. General details of such memory cells are disclosed in the references cited above, and details of a phase change material itself are set out below.

The structural and functional aspects of the memory cell will be discussed first, after which there will follow a detailed discussion of the process for forming the same. The cell is preferably formed on a dielectric layer or substrate 12, preferably consisting of silicon oxide or a well-known alternative thereto, such as a polyimide, silicon nitride or other dielectric fill material. In embodiments, the dielectric layer comprises a relatively good insulator for heat as well as for electricity, providing thermal and electrical isolation. An electrical contact, or plug, 14, preferably formed from a refractory metal such as tungsten, is formed in the oxide layer. Other refractory metals include Ti, Mo, Al, Ta, Cu, Pt, Ir, La, Ni, and Ru. A barrier material 16 is formed on the oxide layer, generally serving to prevent diffusion and to beneficially affect the electric field within the cell, as discussed below. The barrier layer is preferably formed of titanium nitride (TiN) or similar material, such as one or more elements selected from the group consisting of Si, Ti, Al, Ta, N, O, and C. It should be noted that, for purposes of reference only, the direction from the bottom toward the top of the drawings herein is designated "vertical," and the side-to-side direction is "lateral" or "horizontal." Such designations have no effect on the actual physical orientation of a device, either during fabrication or during use.

Phase change element 17 consists primarily of a lower phase change element 18, a kernel element 26, and an upper phase change element 28. Generally, the upper and lower phase change elements have a considerably greater volume than that of the kernel element, and the element is preferably formed as a vertical stack, with the lower phase change element being positioned atop the dielectric layer 12, the kernel element atop the lower phase change element, and the upper phase change element atop the kernel element, in sandwich fashion. The lateral extent of the upper and lower phase change members is significantly greater than that of the kernel element. Those in the art will be able to choose specific values for these parameters, given the requirements of specific design situations.

A dielectric layer 22, preferably formed from silicon dioxide, separates the portions of the two phase change elements extending outwardly from the kernel. One embodiment of the invention includes a barrier metal layer 20 atop the lower phase change element, between that element and the oxide layer. Another layer of barrier metal 24 may be interposed between the dielectric layer 22 and the upper phase change element 28. In embodiments where barrier layer 24 is employed, the barrier does not extend between kernel element 26 and the upper phase change element 28. An upper layer of barrier metal forms an electrode layer 30, which also acts as a diffusion barrier.

Dimensions of the memory cell elements are as follows. Upper and lower phase change elements have thicknesses (in the vertical dimension) of from about 10 nm to about 100 nm, preferably 40 nm. Kernel element 26 has a thickness of from about 10 nm to about 100 nm, preferably 40 nm. Insulating layer 22 has the same thickness as the kernel layer. The barrier layers 16, 20 and 24 have thicknesses of from about 5 nm to about 30 nm, preferably 10 nm. The electrode layer 30 has a thickness of from about 10 nm to about 300 nm, preferably 150 nm. Kernel element 26 further has a width (in the horizontal dimension of FIG. 1) of from about 50 nm to about 300 nm, preferably 150 nm.

Embodiments of the memory cell 10 include phase change-based memory materials, including chalcogenide based materials and other materials, for the phase change element 17. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols. 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including $N_2$ doped GST, $Ge_xSb_y$, or other material that uses different crystal phase changes to determine resistance; $Pr_xCa_yMnO_3$, PrSrMnO, ZrOx, or other material that uses an electrical pulse to change the resistance state; TCNQ, PCBM, TCNQ-PCBM, Cu-TCNQ, Ag-TCNQ, C60-TCNQ, TCNQ doped with other metal, or any other polymer material that has bistable or multi-stable resistance state controlled by an electrical pulse.

As shown, the electric field and current density in the two phase change members are relatively low compared to the values seen in the kernel. The relatively small lateral extent of the kernel member produces current and field densities much higher than those in the phase change members, in turn leading to a significantly higher voltage drop in the kernel area. As a result, the kernel will experience much higher value of heating than will the phase change members, and in fact the phase change will be restricted to the area of the kernel. Both phase change members remain in a SET (crystalline) condition, as they never experience a current flow great enough to generate a phase change to RESET.

In addition, the low heat conductivity of the phase change members reduces the heat transfer from the kernel area, effectively increasing the amount of heat generated within the phase change material per unit value of current. The thermal isolation of the kernel area allows for memory cell design having lower currents than those permitted by the prior art, which in turn allows for reducing the size of the memory cell itself.

In addition, the GST material has significantly lower heat conductivity than does a metallic electrode, so that this design innovation has the effect of retaining heat in the kernel area rather than conducting it, away from the electrode. That leads to the ability to obtain desired phase change results with lower current, which in turn leads to reduced cell size and greater device density.

Figure 2:
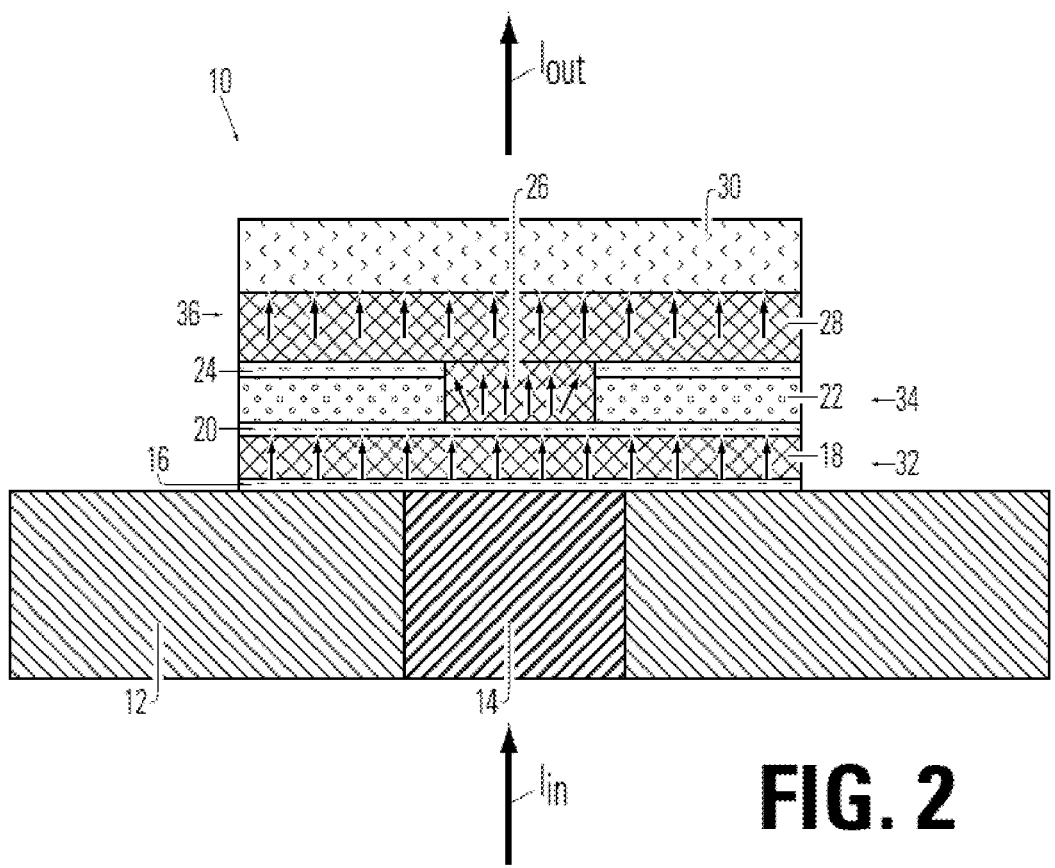
FIG. 2 depicts estimated electric field and current profiles in an embodiment of the invention.

It can be readily seen from FIG. 2 that an important aspect of the invention is the size relationship, and more particularly the width relationship, between upper and lower phase change elements 28 and 18, and kernel element 26. The kernel width should be substantially less than that of the upper and lower members, by which is meant that the kernel should preferably be, at most, half as wide as the upper and lower members, and most preferably a third as wide.

Figure 3A:
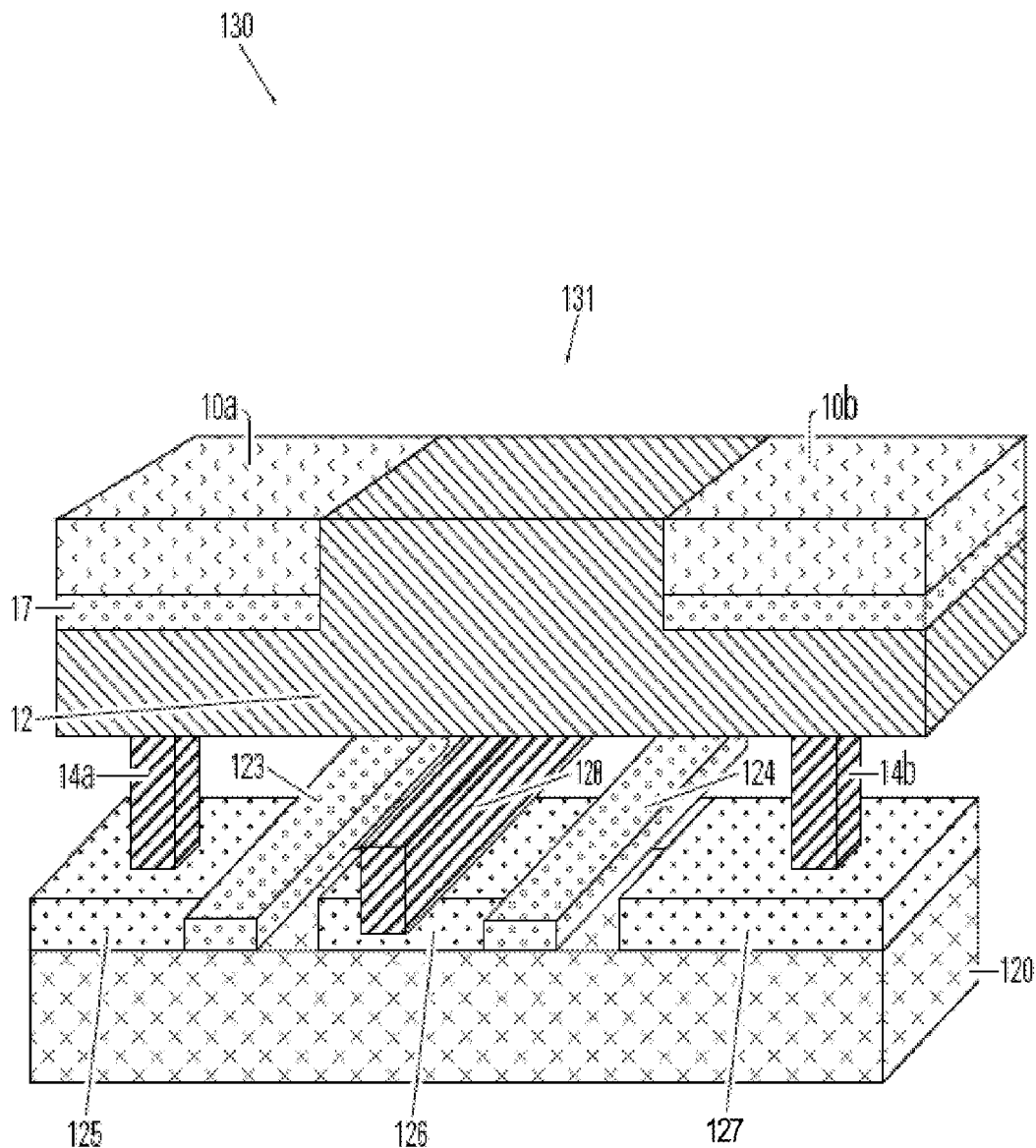
FIGS. 3A and 3B illustrate a computer memory cell including a phase change element according to the present invention.

FIG. 3A depicts a structure for a complete PCRAM cell 130 employing the phase change memory structure of the present invention. As shown, a PCRAM cell includes two transistors and their respective supporting structures, including phase change elements. It is well known in the art to employ two semiconductor devices to form memory cells, as shown here. It should be understood that the semiconductors could easily be diodes or similar devices, as selected to be appropriate for particular applications. The cells are formed on a semiconductor substrate 120. Isolation structures such as shallow trench isolation (STI) dielectrics (not shown) isolate pairs of rows of memory cell access transistors. The access transistors are formed by n-type terminal 126 acting as a common source region and n-type terminals 125 and 127 acting as drain regions in a p-type substrate 120. Polysilicon word lines 123 and 124 form the gates of the access transistors. A dielectric fill layer 12, of which only the upper portion is shown, is formed over the polysilicon word lines. The fill layer is patterned, and conductive structures, including plug structures 14a and 14b are formed. The conductive material can be tungsten or other materials and combinations suitable for the plug and lines structures. The common source line 128 contacts the source region, n-type terminal 126, and acts as a common source line along a row in the array. The plug structures 14a and 14b contact the drain terminals 125 and 127, respectively. The fill layer 12, the common source line 128 and the plug structures 14a and 14b, have a generally planar top surface.

Figure 3B:
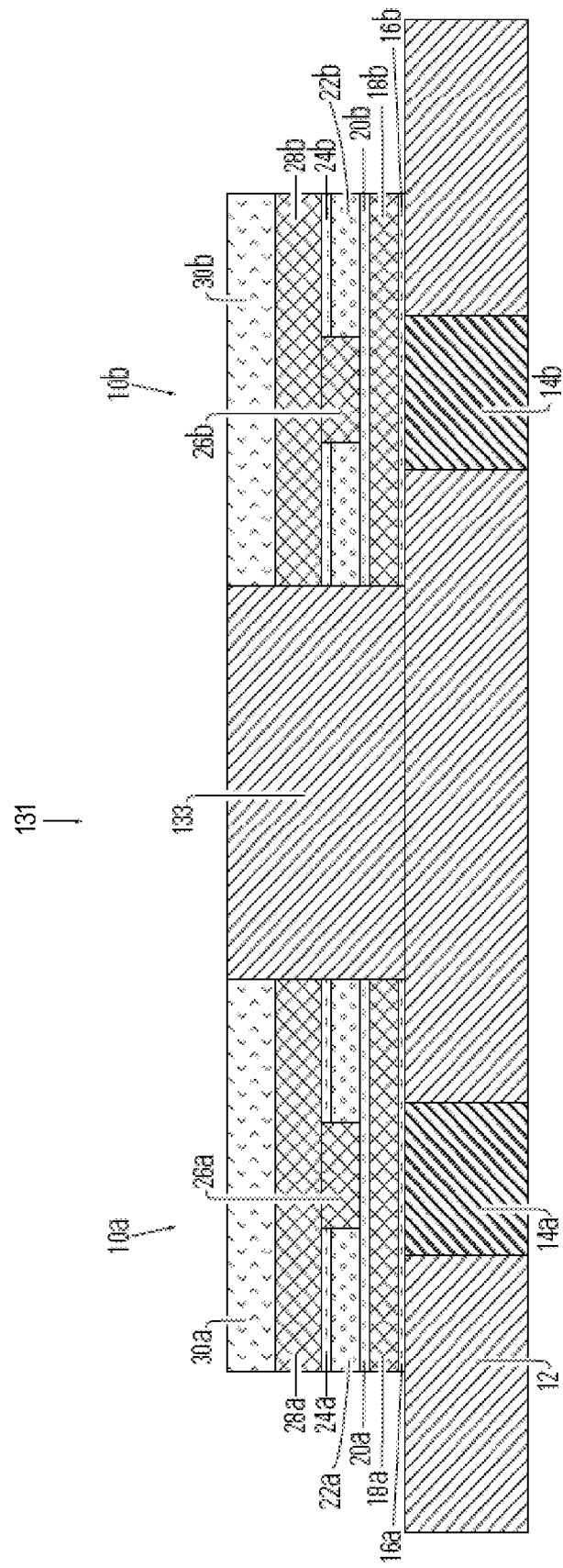

An adaptation of the phase change memory element 10, modified to provide two phase change memory elements in a single unit, can be seen more clearly in the sectional view of FIG. 3B. As seen there, phase change memory elements 10a and 10b are formed as side-by-side elements in element layer 131, separated by dielectric fill block 133. Element layer 131 includes phase change memory elements 10a and 10b and fill block 133, all formed on the upper surface of substrate 12. The fill block 133 can be formed of the same material used in dielectric layer 12, or of some other suitable material known to the art. Each of the phase change elements 10a and 10b is identical to the element 10 described previously. Thus, phase change element 10a includes barrier layers 16a, 20a and 24a, phase change layers 18a and 28a, kernel member 26a and electrode member 30a and phase change element 10b includes barrier layers 16b, 20b and 24b, phase change layers 18b, 28b kernel member 26b, and electrode member 30b.

A dielectric fill layer (not illustrated) overlies the element layer 131. The dielectric fill layer comprises silicon dioxide, a polyimide, silicon nitride or other dielectric fill materials. In embodiments, the fill layer comprises a relatively good insulator for heat as well as for electricity, providing thermal and electrical isolation for the phase change elements. Conventional circuitry (not shown) is added above the element layer 131 to receive output from the phase change elements 10a and 10b.

In operation, access to the memory cell corresponding with phase change element 10a is accomplished by applying a control signal to the word line 123, which couples the common source line 128 via terminal 125 and plug 14a, to the phase change element 10a. Likewise, access to the memory cell corresponding with phase change element 10b is accomplished by applying a control signal to the word line 124.

It will be understood that a wide variety of materials can be utilized in implementation of the structure illustrated in FIGS. 1 and 3B. For example, copper metallization can be used. Other types of metallization, including aluminum, titanium nitride, and tungsten based materials can be utilized as well. Also, non-metal conductive material such as doped polysilicon can be used. The electrode material in the illustrated embodiment is preferably TiN or TaN. Alternatively, the electrodes may be TiAlN or TaAlN, or may comprise, for further examples, one or more elements selected from the group consisting of Ti, W, Mo, Al, Ta, Cu, Pt, Ir, La, Ni, and Ru and alloys thereof.

Figure 4:
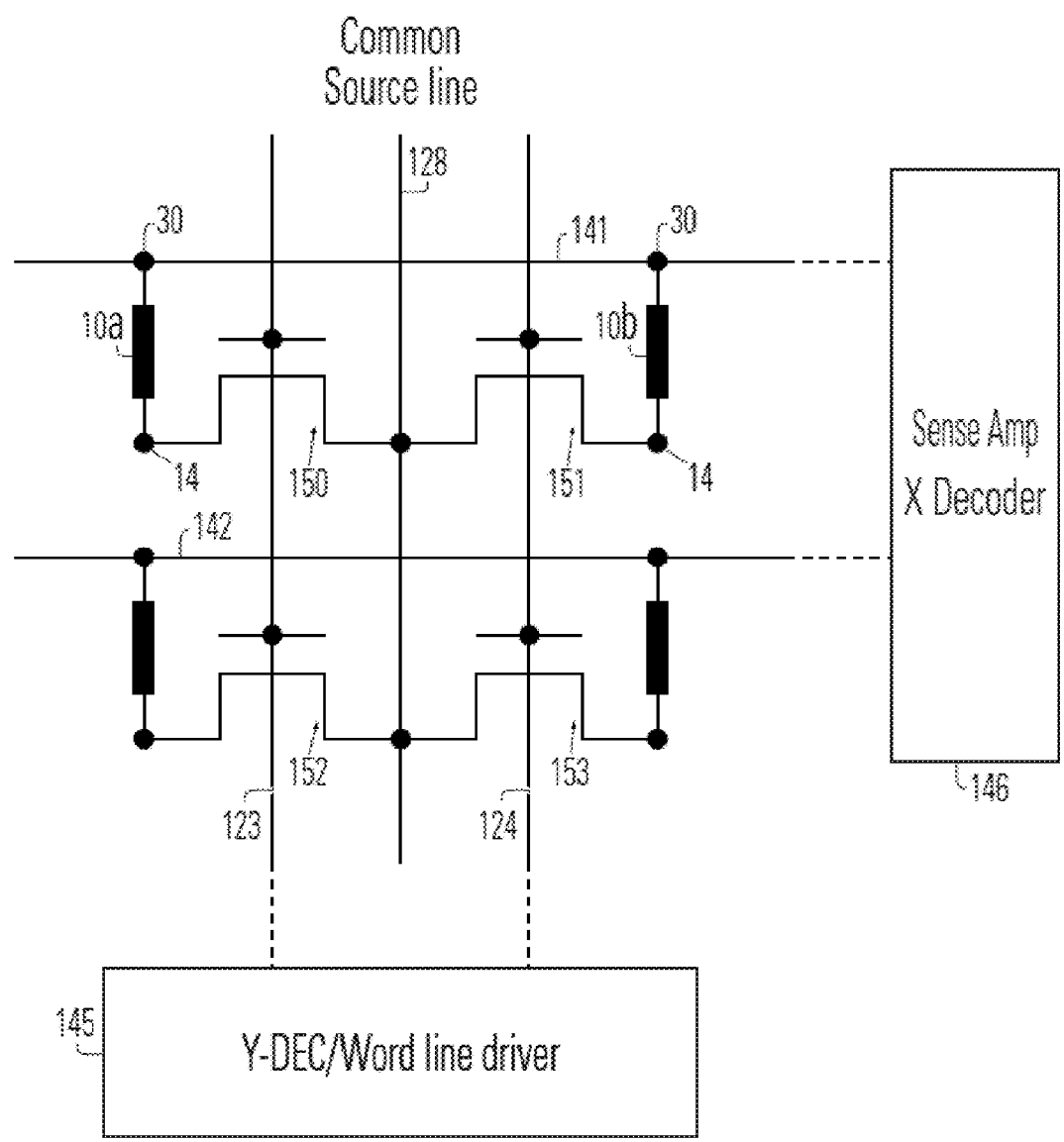
FIG. 4 is a schematic drawing of a computer memory circuit including a phase change element according to the present invention.

FIG. 4 is a schematic illustration of a memory array, which can be implemented as described with reference to FIGS. 3A and 3B. Thus, reference numerals for elements of FIG. 4 match corresponding elements in the structure of FIGS. 3A and 3B. It will be understood that the array structure illustrated in FIG. 4 can be implemented using other cell structures. In a schematic illustration of FIG. 4, the common source line 128, the word line 123 and the word line 124 are arranged generally parallel in the Y-direction. Bit lines 141 and 142 are arranged generally parallel in the X-direction. Thus, a Y-decoder and a word line driver in block 145 are coupled to the word lines 123, 124. An X-decoder and set of sense amplifiers in block 146 are coupled to the bit lines 141 and 142. The common source line 128 is coupled to the source terminals of access transistors 150, 151, 152 and 153. The gate of access transistor 150 is coupled to the word line 123. The gate of access transistor 151 is coupled to the word line 124. The gate of access transistor 152 is coupled to the word line 123. The gate of access transistor 153 is coupled to the word line 124. The drain of access transistor 150 is coupled to the electrode member 14 for phase change memory element 10a, which is in turn coupled to electrode member 30. Likewise, the drain of access transistor 151 is coupled to the electrode member 14 for phase change memory element 10b, which is in turn coupled to the electrode member 30. The electrode member 30 is coupled to the bit line 141. For schematic purposes, the electrode member 30 is illustrated at separate locations on the bit line 141. It will be appreciated that separate electrode members can be utilized for the separate memory cell bridges in other embodiments. Access transistors 152 and 153 are coupled to corresponding memory cells as well on line 142. It can be seen that the common source line 128 is shared by two rows of memory cells, where a row is arranged in the Y-direction in the illustrated schematic. Likewise, the electrode member 30 is shared by two memory cells in a column in the array, where a column is arranged in the X-direction in the illustrated schematic.

Figure 5:
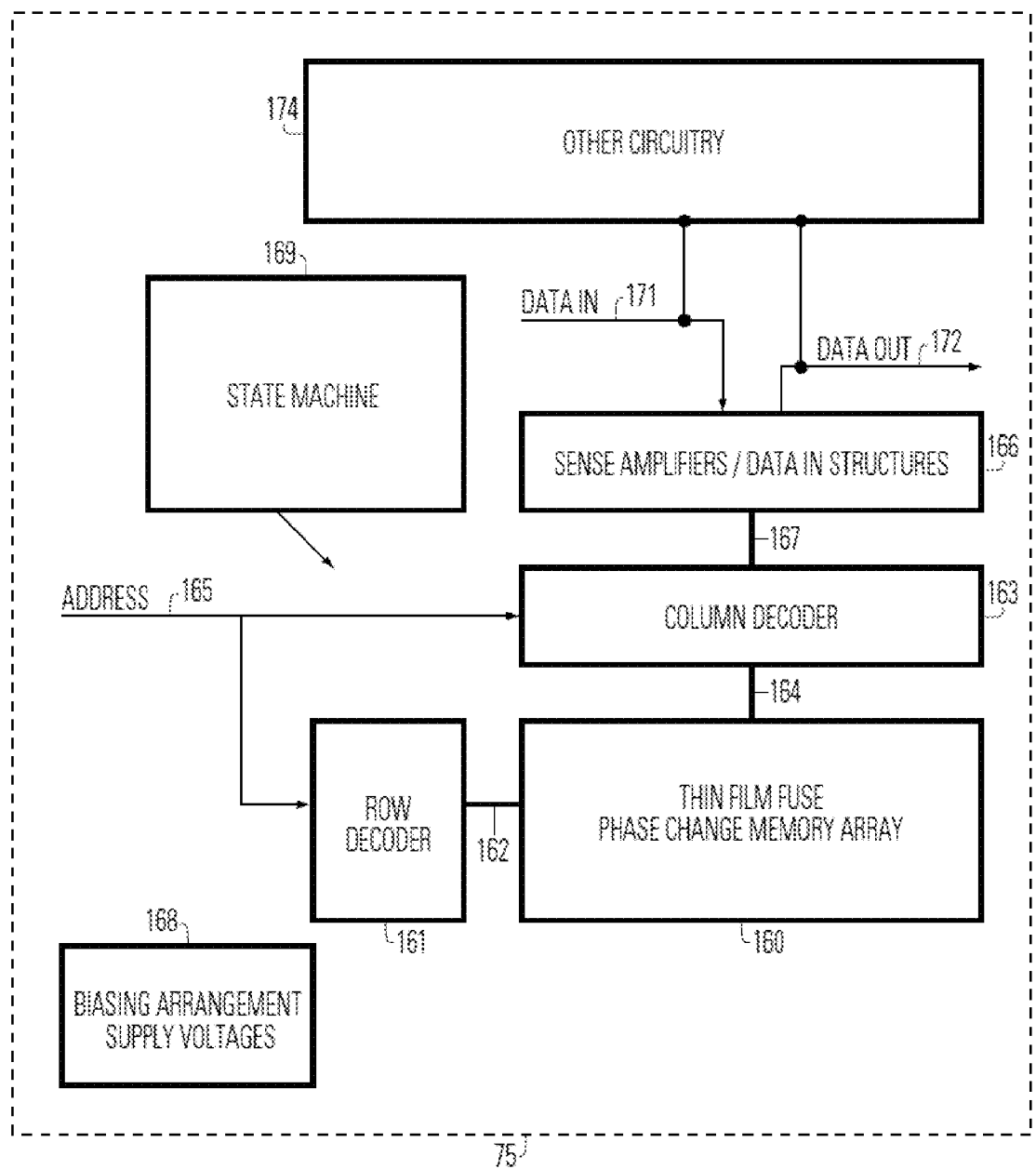
FIG. 5 is a block diagram depicting a computer memory circuit including a phase change element according to the present invention.

FIG. 5 is a simplified block diagram of an integrated circuit according to an embodiment of the present invention. The integrated circuit 174 includes a memory array 160 implemented using thin film fuse phase change memory elements, on a semiconductor substrate. A row decoder 161 is coupled to a plurality of word lines 162, and arranged along rows in the memory array 160. A column decoder 163 is coupled to a plurality of bit lines 164 arranged along columns in the memory array 160 for reading and programming data from the multiple-gate memory cells in the array 160. Addresses are supplied on bus 165 to column decoder 163 and row decoder 161. Sense amplifiers and data-in structures in block 166 are coupled to the column decoder 163 via data bus 167. Data is supplied via the data-in line 171 from input/output ports on the integrated circuit 75 or from other data sources internal or external to the integrated circuit 75, to the data-in structures in block 166. In the illustrated embodiment, other circuitry is included on the integrated circuit, such as a general purpose processor or special purpose application circuitry, or a combination of modules providing system-on-a-chip functionality supported by the thin film fuse phase change memory element array. Data is supplied via the data-out line 172 from the sense amplifiers in block 166 to input/output ports on the integrated circuit 75, or to other data destinations internal or external to the integrated circuit 75.

A controller implemented in this example using bias arrangement state machine 169 controls the application of bias arrangement supply voltages 168, such as read, program, erase, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

The process for fabricating the cell design of the present invention will be discussed in connection with FIGS. 6-10. Those of skill in the art will recognize that generally conventional fabrication techniques are employed, consistent with the need for dimensions in the low nanometer range. The following description does not repeat certain explanations regarding materials and the like, set out above.

Figure 6:
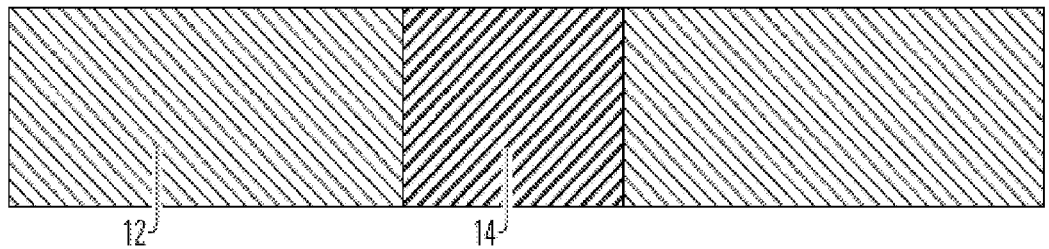
FIG. 6 illustrates a step in the fabrication of the phase change memory cell of the present invention.

FIG. 6 shows the commencement of the process, in which the base layer of the cell is formed. A dielectric layer 12 is formed by conventional means, composed of silicon dioxide, a polyimide, a nitride or other known material having good insulating (both electrical and heat) qualities. A plug 14 provides electrical contact through the dielectric layer, and in one embodiment the plug is tungsten. Other refractory metals can be used here if desired.

Figure 7:
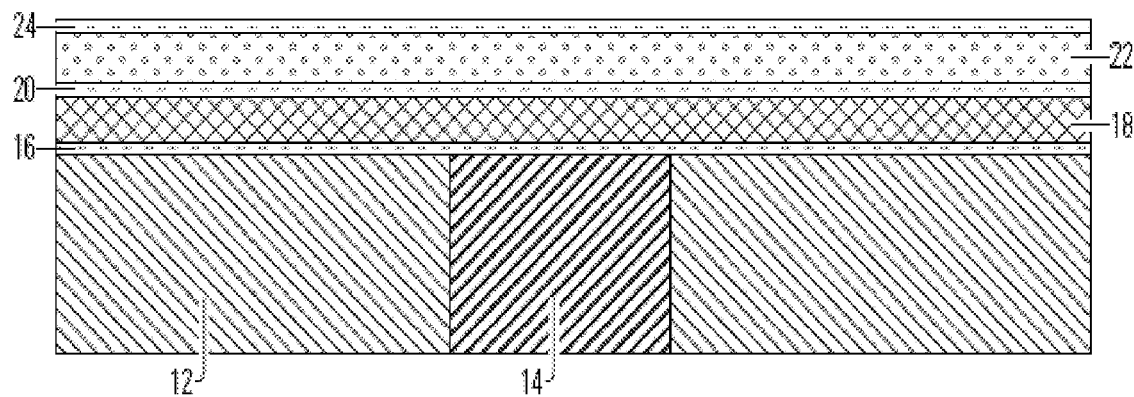
FIG. 7 illustrates a step in the fabrication of the phase change memory cell of the present invention.

Deposition of the first layer of GST material is shown in FIG. 7. A thin film of GST material constitutes the lower phase change member 18, overlying the dielectric layer 12. In one embodiment, the lower phase change member is about 400 Å (40 nm) thick. An additional oxide layer 22 is deposited overlying the first GST layer. The thickness of the second oxide layer is a key dimension of the cell, as discussed below. An embodiment of the invention has a second oxide layer of about 300 Å (30 nm) thick. It is preferred to control potential diffusion into the GST by forming a thin barrier layer 16 between the oxide layer and the first GST layer, as well as additional barrier layers 20 and 24 above and below oxide layer 22, respectively. In one embodiment, the barrier films are each about 100 Å (10 nm) thick.

Any of the conventional barrier metals can be employed here, as known to those in the art. It is preferred to utilize either TiN or TaN in this application. An additional benefit of employing a metallic barrier layer is that it helps make the electric field more uniform, leading to predictable field and current profiles in the GST material.

Figure 8:
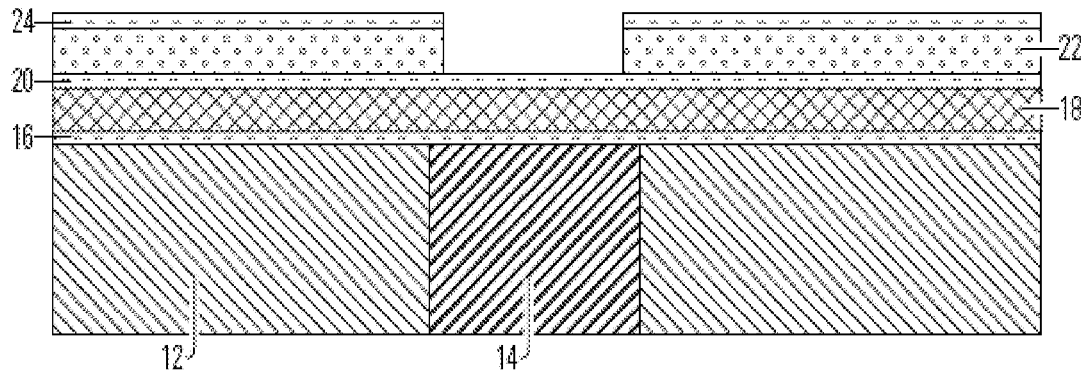
FIG. 8 illustrates a step in the fabrication of the phase change memory cell of the present invention.
Figure 8A:
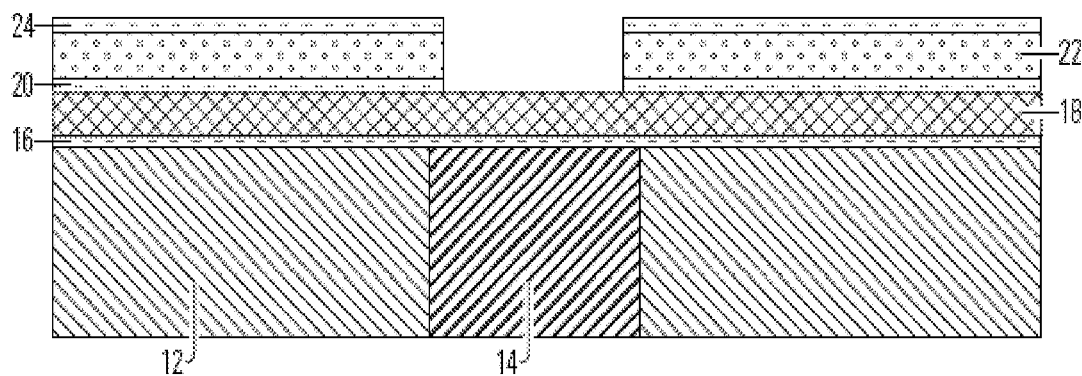
FIG. 8A illustrates an alternative step in the fabrication of the phase change memory cell of the present invention.

FIG. 8 depicts the next steps, in which a cavity 25 is formed into the center of the second oxide layer and its overlying barrier layer, following conventional photolithography patterning techniques for depositing a patterned photoresist layer, an anisotropic etch step to remove material in the barrier and oxide layers, and a stripping step to remove the photoresist pattern. The etch step may be controlled to stop at the barrier layer 20, either through selective etching or time control techniques known in the art. As will be discussed further below, one embodiment stops the etching at the barrier layer 20, while others etch through that layer entirely. FIG. 8A illustrates the structure that results from continuing the etch completely through the barrier layer 20. It will be appreciated that the choice between retaining or etching this portion of barrier layer 20 should be made after balancing the advantage of managing the electric field (provided by the barrier layer) or in eliminating a resistance source within the phase change material, inasmuch as the barrier layer does contribute some amount of ohmic resistance to the device.

Figure 9:
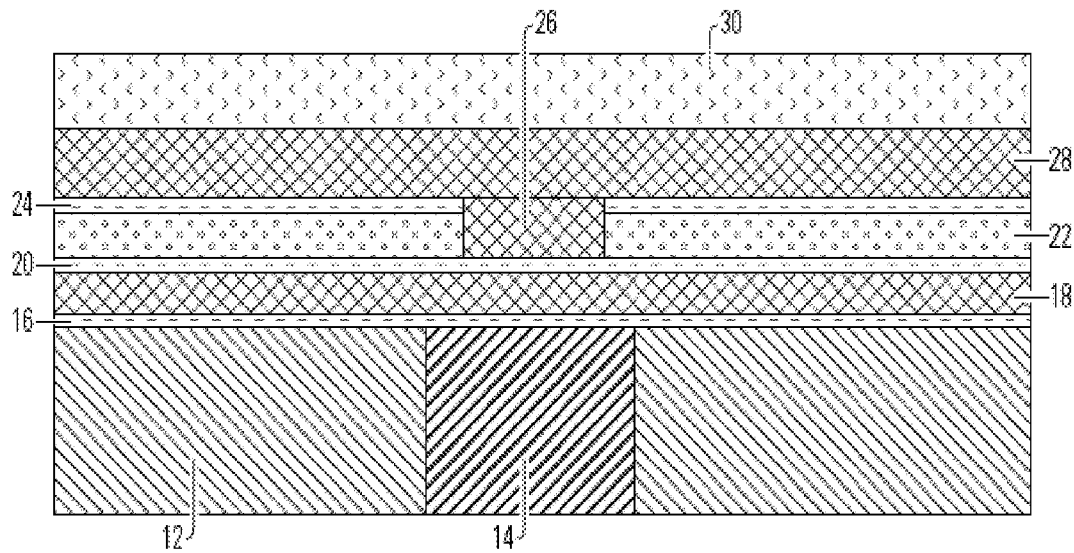
FIG. 9 illustrates a step in the fabrication of the phase change memory cell of the present invention.
Figure 10:
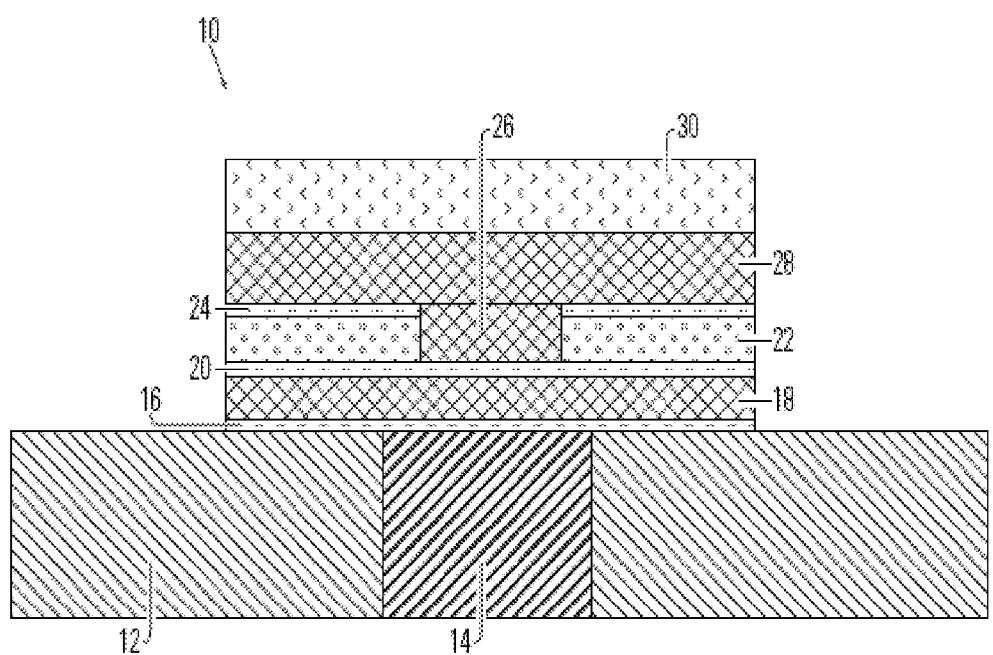
FIG. 10 illustrates a step in the fabrication of the phase change memory cell of the present invention.

Deposition of further GST material in FIG. 9 forms the upper phase change member and the kernel member 26, over which is deposited the upper electrode layer 30. The latter element is preferably formed from barrier material such as TiN to achieve diffusion isolation of the GST material. Both the upper phase change element and the upper electrode are preferably deposited to thickness of about 400 Å (40 nm).

The final cell configuration 10, best seen in FIG. 1, is achieved by patterning photoresist over the central portion of the structure shown in FIG. 9 and etching the material to either side of the pattern, preferably down to the level of first dielectric layer 12. The lateral dimension of the cell, as well as the spacing between cells, can be selected by those of skill in the art, considering well-known factors such as heat dissipation and current isolation requirements.

It will be appreciated that fabrication of the two-element structure shown in FIG. 3B proceeds exactly as described above, with the exception that formation of kernel elements 26a and 26b requires that two, not one, cavities be patterned and formed. Those of skill in the art will understand that requirement clearly.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

We claim as follows:

1. A method of forming a memory device, comprising:
providing a bottom electrode;
depositing a first memory layer over the bottom electrode;
sequentially depositing a barrier and an insulating layer over the first memory layer;
etching at least the insulating layer to form a cavity;
depositing a second memory layer into and filling the cavity and over the insulating layer; and
forming a top electrode over the second memory layer.

2. The method of claim 1 wherein sequentially depositing the barrier and the insulating layer comprises depositing the barrier prior to depositing the insulating layer.

3. The method of claim 2, further comprising, prior to etching to form the cavity, depositing an upper barrier over the insulating layer, and wherein etching to form the cavity comprises etching at least through the upper barrier and the insulating layer.

4. The method of claim 3 wherein etching to form the cavity comprises etching through the upper barrier, the insulating layer, and the barrier.

5. The method of claim 1 wherein sequentially depositing the barrier and the insulating layer comprises depositing the insulating layer prior to depositing the barrier.

6. The method of claim 5 wherein etching to form the cavity comprises etching at least through the barrier and the insulating layer.

7. The method of claim 5, further comprising, prior to depositing the insulating layer, depositing a lower barrier over the first memory layer.

8. The method of claim 7 wherein etching to form the cavity comprises etching at least through the barrier and the insulating layer.

9. The method of claim 8 wherein etching to form the cavity comprises etching through the barrier, the insulating layer, and the lower barrier.

10. The method of claim 1 wherein depositing the first memory layer comprises depositing a memory material film.

11. The method of claim 10 wherein depositing the first memory layer comprises depositing a film having a thickness in a range about 10 nm to about 100 nm.

12. The method of claim 10 wherein depositing the first memory layer comprises depositing a film having a thickness about 40 nm.

13. The method of claim 1 wherein depositing the first memory layer comprises depositing a GST material.

14. The method of claim 1 wherein depositing the insulating layer comprises depositing a dielectric material.

15. The method of claim 1 wherein depositing the insulating layer comprises depositing an oxide material.

16. The method of claim 15 wherein depositing an oxide material comprises depositing silicon dioxide.

17. The method of claim 14 wherein depositing the insulating layer comprises depositing the dielectric material to a thickness about 30 nm.

18. The method of claim 14 wherein depositing the barrier comprises depositing a barrier material to a thickness in a range about 5 nm to about 30 nm.

19. The method of claim 14 wherein depositing the barrier comprises depositing a barrier material to a thickness about 10 nm.

20. The method of claim 14 wherein depositing the barrier comprises depositing a nitride material.

21. The method of claim 14 wherein depositing the barrier comprises depositing a nitride material selected from the group consisting of TiN and TaN.

22. The method of claim 14 wherein depositing the barrier comprises depositing a nitride material selected from the group consisting of TiN and TaN.

23. The method of claim 1 wherein etching to form a cavity comprises carrying out an anisotropic etch.

24. The method of claim 1 wherein etching to form a cavity comprises etching to form a cavity having a width in a range about 50 nm to about 300 nm.

25. The method of claim 24 wherein etching to form a cavity comprises etching to form a cavity having a width about 150 nm.

26. The method of claim 1 wherein etching to form a cavity comprises etching to form a cavity having a depth in a range about 10 nm to about 100 nm.

27. The method of claim 26 wherein etching to form a cavity comprises etching to form a cavity having a depth about 40 nm.

28. The method of claim 26 wherein depositing the second memory layer comprises depositing a memory material film.

29. The method of claim 27 wherein depositing the second memory layer comprises depositing a film having a thickness in a range about 10 nm to about 100 nm.

30. The method of claim 29 wherein depositing the second memory layer comprises depositing a film having a thickness about 40 nm.

31. The method of claim 1 wherein depositing the second memory layer comprises depositing a GST material.

32. The method of claim 1 wherein depositing the first memory layer and the second memory layer comprise depositing the same memory material.

33. The method of claim 1 wherein forming the top electrode comprises forming a metal layer.

34. The method of claim 33 wherein forming the top electrode comprises forming a layer of a barrier metal.

35. The method of claim 1 wherein forming the top electrode comprises forming a metal layer having a thickness in a range about 10 nm to about 300 nm.

36. The method of claim 35 wherein forming the top electrode comprises forming a metal layer having a thickness in a range about 150 nm.

* * * * *

UNITED STATES PATENT AND TRADEMARK OFFICE
CERTIFICATE OF CORRECTION

PATENT NO. : 7,993,962 B2  
APPLICATION NO. : 12/614902  
DATED : August 9, 2011  
INVENTOR(S) : Shih-hung Chen et al.

It is certified that error appears in the above-identified patent and that said Letters Patent is hereby corrected as shown below:

In the Claims:

In Column 11, delete lines 12 - 14  
In Column 11, line 15 delete "23" and insert --22--  
In Column 11, line 17 delete "24" and insert --23--  
In Column 11, line 20 delete "25" and insert --24--  
In Column 11, line 20 delete "claim 24" and insert --claim 23--  
In Column 11, line 23 delete "26" and insert --25--  
In Column 11, line 26 delete "27" and insert --26--  
In Column 11, line 26 delete "claim 26" and insert --claim 25--  
In Column 12, line 1 delete "28" and insert --27--  
In Column 12, line 1 delete "claim 26" and insert --claim 25--  
In Column 12, line 3 delete "29" and insert --28--  
In Column 12, line 3 delete "claim 27" and insert --claim 26--  
In Column 12, line 6 delete "30" and insert --29--  
In Column 12, line 6 delete "claim 29" and insert --claim 28--  
In Column 12, line 9 delete "31" and insert --30--  
In Column 12, line 11 delete "32" and insert --31--  
In Column 12, line 14 delete "33" and insert --32--  
In Column 12, line 16 delete "34" and insert --33--  
In Column 12, line 16 delete "claim 33" and insert --claim 32--  
In Column 12, line 18 delete "35" and insert --34--  
In Column 12, line 21 delete "36" and insert --35--  
In Column 12, line 21 delete "claim 35" and insert --claim 34--

Signed and Sealed this  
Twenty-fifth Day of September, 2012

David J. Kappos  
*Director of the United States Patent and Trademark Office*